United States Patent
Buerkert et al.

(10) Patent No.: US 9,181,437 B2
(45) Date of Patent: Nov. 10, 2015

(54) BATH DEPOSITION SOLUTION FOR THE WET-CHEMICAL DEPOSITION OF A METAL SULFIDE LAYER AND RELATED PRODUCTION METHOD

(75) Inventors: Linda Buerkert, Kuenzelsau (DE); Dimitrios Hariskos, Kornwestheim (DE); Torsten Kolb, Heidelberg (DE); Bettina Fuchs, Rechenberg (DE)

(73) Assignee: Manz CIGB Technology GmbH, Schwaebisch Hall (DE)

(*) Notice: Subject to any disclaimer, the term of this patent is extended or adjusted under 35 U.S.C. 154(b) by 445 days.

(21) Appl. No.: 13/575,670

(22) PCT Filed: Jan. 27, 2011

(86) PCT No.: PCT/EP2011/051117
§ 371 (c)(1),
(2), (4) Date: Dec. 12, 2012

(87) PCT Pub. No.: WO2011/092236
PCT Pub. Date: Aug. 4, 2011

(65) Prior Publication Data
US 2013/0084401 A1    Apr. 4, 2013

(30) Foreign Application Priority Data
Jan. 28, 2010  (DE) .......................... 10 2010 006 499

(51) Int. Cl.
*C23C 18/12* (2006.01)
*C09D 1/00* (2006.01)
(Continued)

(52) U.S. Cl.
CPC .............. *C09D 1/00* (2013.01); *C23C 18/1204* (2013.01); *H01L 21/02472* (2013.01); *H01L 21/02474* (2013.01); *H01L 21/02483* (2013.01); *H01L 21/02557* (2013.01); *H01L 21/02568* (2013.01);
(Continued)

(58) Field of Classification Search
CPC ..................... C23C 18/1204; H01L 21/02557; H01L 21/02628; H01L 31/0749
USPC ............................................... 106/1.22, 1.29
See application file for complete search history.

(56) References Cited

U.S. PATENT DOCUMENTS

| 7,704,863 | B2 | 4/2010 | Ennaoui et al. |
| 8,071,400 | B2 * | 12/2011 | Kawano .......................... 438/22 |
| 8,138,009 | B2 * | 3/2012 | Ahn ............................... 438/57 |

(Continued)

FOREIGN PATENT DOCUMENTS

| CN | 101608304 A | 12/2009 |
| WO | WO 2006/018013 A1 | 2/2006 |

OTHER PUBLICATIONS

Oladeji et al., "A Study of the Effects of Ammonium Salts on Chemical Bath Deposited Zinc Sulfide Thin Films", Thin Solod Films 339, pp. 148-153; 1999, no month available.*

(Continued)

*Primary Examiner* — Helene Klemanski
(74) *Attorney, Agent, or Firm* — Crowell & Moring LLP

(57) ABSTRACT

A bath deposition solution for the chemical bath deposition of a metal sulfide layer, a process for the production of such a bath deposition solution, and a process for producing a metal sulfide layer on a substrate using such a bath deposition solution are provided. The bath deposition solution contains a metal salt, an organosulfide, a chelating agent which with metal ions of the metal salt forms a chelate complex and ammonium hydroxide.

7 Claims, 3 Drawing Sheets

(51) Int. Cl.
*H01L 21/02* (2006.01)
*H01L 31/0749* (2012.01)

(52) U.S. Cl.
CPC ...... *H01L 21/02628* (2013.01); *H01L 31/0749* (2013.01); *Y02E 10/541* (2013.01)

(56) References Cited

U.S. PATENT DOCUMENTS

| | | | |
|---|---|---|---|
| 8,252,611 B2* | 8/2012 | Kawano | 438/22 |
| 2006/0024960 A1* | 2/2006 | Meth | 438/650 |
| 2007/0020400 A1 | 1/2007 | Chang | |
| 2008/0283874 A1* | 11/2008 | Peeters et al. | 257/213 |
| 2008/0299411 A1 | 12/2008 | Oladeji | |
| 2011/0111129 A1* | 5/2011 | Chen | 427/372.2 |
| 2012/0176681 A1* | 7/2012 | Chang et al. | 359/614 |

OTHER PUBLICATIONS

Oledeji et al., "Comparative Study of CdS Thin Films Deposited by Single, Continuous, and Multiple Dip Chemical Processes", Thin Solid Films 359, pp. 154-159; 2000, no month available.*

Lee et al., "Deposition and Optical Properties of Nanocyrstalline ZnS Thin Films by a Chemical Method", Current Applied Physics, pp. 193-197, vol. 7; Jul. 2006.*

International Search Report with Partial Translation Dated Jun. 26, 2013 (Fourteen (14) pages).

D. A. Johnston et al., "Chemical bath deposition of zinc sulfide based buffer layers using low toxicity materials,"Thin Solid Films, 2002, pp. 102-106, vol. 403-404, Elsevier Science B. V., XP 4430335AI.

N. Lejmi et al., "The effect of of heteropolyacids and isopolyacids on the properties of chemically bath deposited CdS thin films," Solar Energy Materials & Solar Cells, 2001, pp. 71-83, vol. 70, Elsevier Science B. V., XP4298832A1.

J. P. Enriquez et al., "Influence of the thickness on structural, optical and electrical properties of chemical bath deposited CdS thin films," Solar Energy Materials & Solar Cells, 2003, pp. 313-322, vol. 76, Elsevier Science B. V., XP 4404677AI.

L. Chen et al., "The Effects of the Complexing Agents on the Growth and Properties of Modified Chemical-bath-deposited ZnS Thin Films," IEEE International Conference on Nano/Micro Engineered and Molecular Systems, pp. 599-602, Zhuhai, China, XP 31063921AI, Jan. 2006.

Chinese Office Action dated Mar. 3, 2014, English translation only (Eighteen (18) pages).

Reza Sahraei et al., "Compositional, structural, and optical study of nanocrystalline ZnS thin films prepared by a new chemical bath deposition route", Journal of Alloys and Compounds, pp. 488-492, vol. 466, Elsevier., Dec. 2007.

Alireza Goudarzi et al., "Ammonia-free chemical bath deposition of nanocrystalline ZnS thin film buffer layer for solar cells", Thin Solid Films, pp. 4953-4957, vol. 516, Elsevier., Oct. 2007.

Saravanan Nagalingam et al., "The Effect of EDTA on the Deposition of ZnS Thin Film", Z. Phys. Chem, pp. 1703-1710, vol. 222., Oct. 2008.

German Search Report dated Nov. 17, 2010 including partial English-language translation (Nine (9) pages).

* cited by examiner

I-U curve of a 30 cm * 30 cm² CIGS module with CBD ZnS buffer
Heterostructure: Glass/Mo/CIGS/ZnS/ZnMgO/ZnO:Al

BATH DEPOSITION SOLUTION FOR THE WET-CHEMICAL DEPOSITION OF A METAL SULFIDE LAYER AND RELATED PRODUCTION METHOD

BACKGROUND AND SUMMARY OF THE INVENTION

The invention relates to a bath deposition solution for the chemical bath deposition of a metal sulfide layer, to a process for the production of such a bath deposition solution and to a process for producing a metal sulfide layer on a substrate using such a bath deposition solution. The invention is particularly suitable for the chemical bath deposition (CBD) of a zinc sulfide layer (known as CBD zinc sulfide layer) as buffer layer on an absorber layer in the manufacture of photovoltaic thin film components. For the present purposes, such CBD zinc sulfide layers are layers which can contain not only zinc and sulfur but also, due to the method of production, oxygen in a proportion dependent on the preparation conditions, and the layers are then also referred to formally as Zn(S,O) layers or $ZnSi_{1-x}O_x$ layers where $0 \leq x < 1$ or Zn(S,O,OH) layers or ZnS(O,OH) layers, in the technical literature.

Especially for said ZnS buffer layer deposition in solar cell applications, various procedures have already been proposed. Thus, for example, it is known from the laid-open publications WO 2006/018013 A1 and DE 10 2006 039 331 A1 that a bath deposition solution prepared in a specific way from zinc sulfate, thiourea and ammonia dissolved in distilled water can be used for this purpose, where the temperature of the deposition solution is maintained at from 70° C. to 90° C. during the deposition process or is ramped up to such a temperature value. On the basis of experience, production of a ZnS buffer layer having a layer thickness in the order of 25 nm as is typically required requires a deposition time of at least about 15 minutes when using this deposition process.

ZnS buffer layers have recently been found to be very useful as an alternative to cadmium sulfide (CdS) buffer layers. Here, ZnS buffer layers are known to be less problematical than CdS buffer layers from an environmental point of view and transparent buffer layers can be produced therefrom. Compared to CdS, ZnS has a higher band gap and absorbs very little in the wavelength range from 300 nm to 500 nm. As a result, more light reaches the photovoltaically active absorber layer, which leads to a higher current density and a potentially higher efficiency. Furthermore, there has recently been increasing demand for the commercial manufacture of large-area photovoltaic modules, e.g. of the CIS or CIGS type. There is therefore great interest in a rapid and inexpensive process by means of which ZnS buffer layers can be deposited in the required layer quality over a large area of an appropriate substrate, i.e. a corresponding solar cell absorber layer. CBD zinc sulfide layers are of particular interest for this purpose, especially also when they contain oxygen as a result of the method of manufacture, as indicated above. The conduction band offset relative to the adjacent CIS absorber layer material can in this way be reduced from about 1.6 eV to about 1.0 eV or less. Depending on the oxygen content and any hydrogen or hydroxide content, the CBD zinc sulfide layers can be binary compounds composed of the elements Zn and S, ternary compounds composed of the elements Zn, O and S or the constituents Zn, S and OH, quaternary compounds composed of the constituents Zn, S, O and OH or the constituents Zn, S, O and H or oxygen- and/or hydrogen-doped ZnS layers, with continuous transitions between these types of compound naturally also being possible depending on the proportion or doping concentration of the constituent concerned.

The journal article R. Sahraei et al., Compositional, structural, and optical study of non-crystalline ZnS thin films prepared by a new chemical bath deposition route, J. of Alloys and Compounds 466 (2008), page 488, discloses a ZnS buffer layer deposition process in which a weakly acidic solution having a pH of about 5 and containing zinc chloride ($ZnCl_2$), nitrilotriacetic acid (NTA) thioacetamide (TAA) and sodium hydroxide (NaOH) to adjust the pH is used as bath deposition solution. Deposition is carried out for up to about 6 hours at a temperature of about 70° C. in order to achieve a layer thickness of about 80 nm, with this deposition process being repeated if required in order to achieve greater layer thicknesses.

The journal article A. Goudarzi et al., Ammonia-free chemical bath deposition of nanocrystalline ZnS thin film buffer layer for solar cells, Thin Solid Films, 516 (2008), page 4953, discloses a ZnS buffer layer deposition process in which an ammonia-free, weakly acidic bath deposition solution having a pH of about 6.0 and containing zinc acetate, TAA, NaOH for adjusting the pH and a sodium salt of ethylenediaminetetraacetic acid ($Na_2EDTA$) dissolved in distilled water is used. Layer thicknesses of from about 20 nm to 140 nm are achieved for the ZnS layer deposited in deposition times of from about 30 minutes to seven hours using this bath deposition solution.

In the journal article S. Nagalingam et al., The Effect of EDTA on the Deposition of ZnS Thin Film, Z. Phys. Chem. 222 (2008), page 1703, electrodeposition of a ZnS buffer layer in a distinctly acidic deposition solution having a pH of not more than 4 and preferably about 1.26, where the deposition solution contains $ZnCl_2$, $Na_2S_2O_3$, NaEDTA and hydrochloric acid (HCl) to adjust the pH dissolved in distilled water, is proposed as an alternative to electroless chemical bath deposition.

Laid-open publication US 2007/0020400 A1 discloses a process for the continuous deposition of thin layers, for example ZnS and CdS layers, using a micromixer and a microchannel applicator. In this micromixer, two preferably liquid reactants are mixed in order to provide the deposition material desired for the deposition, for example a solution of cadmium chloride, ammonium chloride and ammonium hydroxide as first reactant and aqueous urea as second reactant for the deposition of a CdS layer. The deposition Material provided, e.g. in the form of appropriate CdS particles for the deposition of a CdS layer, is then directed in the form of a jet onto the surface to be coated by means of the microchannel applicator.

The technical problem addressed by the invention is to provide a bath deposition solution, an accompanying process for producing the solution and also a metal sulfide layer production process using this, which allows the electroless, chemical bath deposition of a metal sulfide layer of good quality, as is required, for example, for ZnS buffer layers in solar cell applications, with a short deposition time and which are also suitable, in particular, for large-area deposition as is required, for example, for ZnS buffer layers in the manufacture of large-area photovoltaic modules.

The invention solves this problem by providing a bath deposition solution for the chemical bath deposition of a metal sulfide layer, wherein it contains: a metal salt, an organosulfide, a chelating agent which with metal ions of the metal salt forms a chelate complex and ammonium hydroxide. The invention further solves this problem by providing a bath deposition solution production process for producing a bath deposition solution for chemical bath deposition of a metal sulfide layer, wherein a metal salt, an organosulfide, a chelating agent which with metal ions of the metal salt forms a chelate complex and ammonium hydroxide are mixed in distilled water. The invention still further solves this problem by providing a metal sulfide layer production process for producing a metal sulfide layer on a substrate, which comprises the following steps: provision of the inventive bath deposition solution, and chemical bath deposition of the metal sulfide layer on the substrate by bringing the substrate into contact with the bath deposition solution.

The bath deposition solution for the chemical bath deposition of a metal sulfide layer characteristically comprises a salt of the metal required for the metal sulfide layer and also an organosulfide as sulfur source for the metal sulfide layer, a chelating agent which forms a chelated complex with metal ions of the metal salt and ammonium hydroxide. One or more further constituents can optionally be present in a low concentration.

It has been found that the presence of the organosulfide as supplier of sulfur and also both the chelating agent and ammonium hydroxide makes it possible to achieve very advantageous, fast deposition of a metal sulfide layer of good quality even on relatively large areas, for which the interaction of the chelating agent, which due to its strong shielding effect makes it difficult for the metal ions to access the sulfur ions liberated from the organosulfide, and the ammonium hydroxide is considered to be responsible, with the ammonium hydroxide not only acting as agent to adjust the pH but also functioning as weak metal ion shielding component. The inventors have found that this composition of the bath deposition solution enables, for example, ZnS buffer layers having a thickness of about 25 nm and a good layer quality to be deposited in a deposition time of less than about 10 minutes, in particular only about 4 minutes.

While a Zn salt is used as metal salt for the deposition of ZnS layers such as said buffer layers for solar cell applications, it is possible, according to the invention, for other metal sulfide layers, e.g. of In or combinations of the metals Zn and In, to be chemically bath deposited in the same way using corresponding metal salts.

In an advantageous embodiment, thioacetamide (TAA) is used as organosulfide. It has been found that it is in this way possible to achieve more rapid liberation of sulfur, for example compared to thiourea, which can be explained by a higher hydrolysis sensitivity of TAA. An excessively rapid metal sulfide formation reaction associated with undesirable colloidal deposits of the metal sulfide or poor covering/morphology characteristics is prevented by controlled slowing of the attachment of sulfur to the metal ion due to the shielding effect of the chelating agent and of the ammonium hydroxide or ammonia.

In an advantageous embodiment of the invention, nitrilotriacetic acid (NTA) or iminodiacetic acid (IDA) or an appropriate salt of these acids, e.g. a sodium salt, ammonium salt etc. is used as chelating agent. It has been found that the use of such a chelating agent in combination with a suitable organosulfide, e.g. TAA, makes it possible to achieve good matching of the rate of liberation of sulfur by the organosulfide and the attachment of sulfur to the metal ion which has been slowed by the chelating agent in such a way that the metal sulfide layer can be deposited with comparatively very good quality and a high deposition rate of, for example, about 6 nm/min.

In an embodiment of the invention, the metal salt is present in a concentration of from about 1 mM to about 50 mM and/or the organosulfide is present in a concentration of from about 1 mM to about 150 mM and/or the chelating agent is present in a concentration of from about 0.01 M to about 1.0 M and/or the ammonium hydroxide is present in a concentration of from about 0.01 M to about 3.0 M in the bath deposition solution. These concentration ranges have been found to be particularly useful for achieving metal sulfide layers of good quality at a satisfactorily high deposition rate combined with a comparatively low usage of materials.

In a further embodiment of the invention, a pH in the basic range through to the neutral range is set for the bath deposition solution. It has been found that this enables advantageous chemical bath deposition of the metal sulfide layer to be achieved.

The bath deposition solution of the invention can, according to the invention, be produced easily by simple mixing of the participating constituents in distilled water.

When the bath deposition solution of the invention is used, it is possible, as mentioned, for metal sulfide layers to be chemically bath deposited on a substrate with comparatively good layer quality and a high deposition rate. Thus, for example, a ZnS buffer layer can be deposited on a photovoltaic absorber layer substrate by means of this process of the invention, with the layer quality required for such a buffer layer and a layer thickness of about 25 nm being able to be achieved at very short deposition times of not more than about 10 minutes and preferably not more than about 4 minutes or less.

In an embodiment of this metal sulfide layer production process according to the invention, the bath solution is maintained at a temperature of from about 40° C. to about 90° C. during the deposition process.

In a further embodiment of the invention, the contacting of the substrate with the bath deposition solution is effected by dipping the substrate into the bath deposition solution or equivalent contacting of the area of the substrate surface to be coated with the bath deposition solution by means of an appropriate wetting or spraying technique.

BRIEF DESCRIPTION OF THE DRAWINGS

Advantageous embodiments of the invention are presented in the drawings and are described below. Here.

DETAILED DESCRIPTION OF THE DRAWINGS

Figure 1:
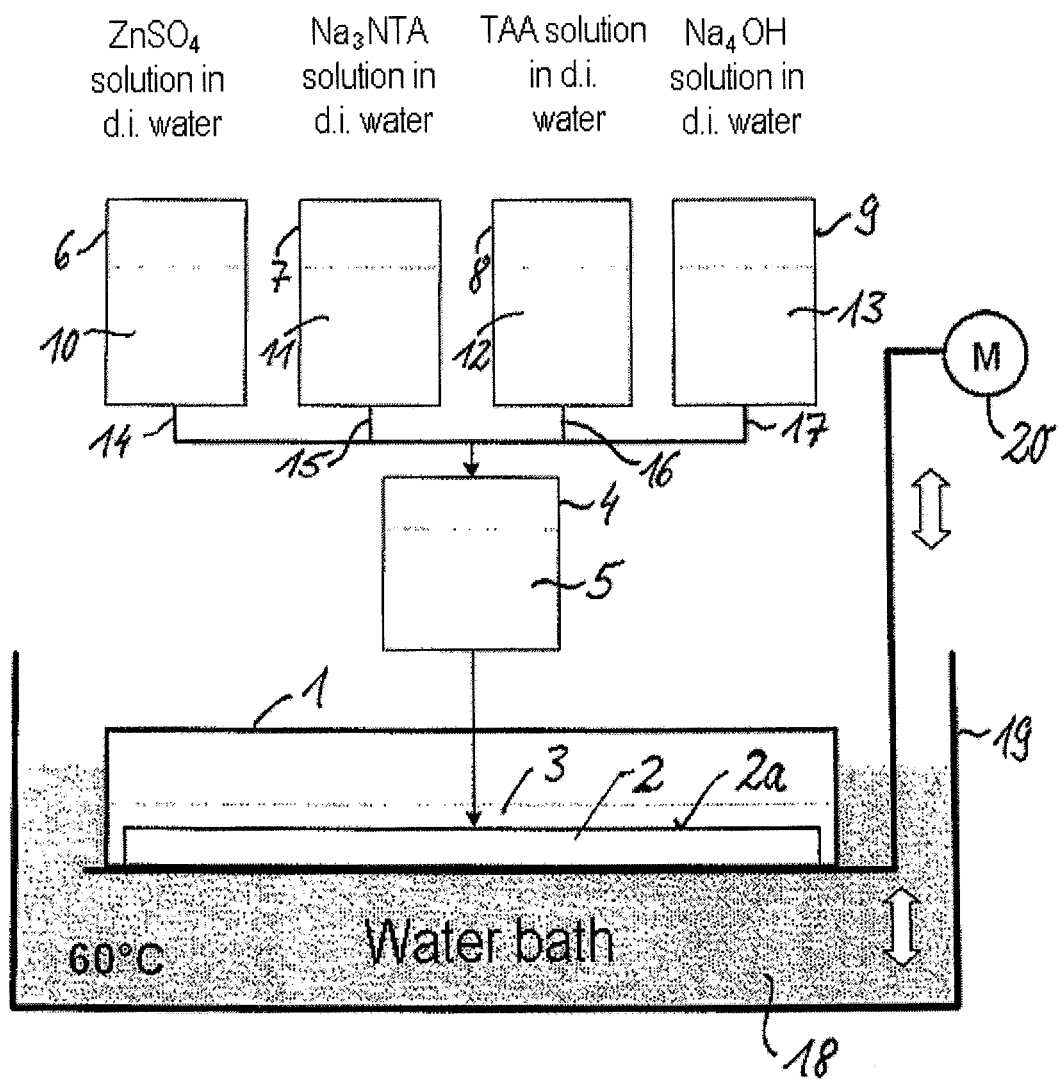
FIG. 1 schematically shows an equipment for the chemical bath deposition of a metal sulfide layer.

The coating equipment shown in FIG. 1 serves for the chemical bath deposition of metal sulfide layers on appropriate substrates. For this purpose, the coating equipment has, in the usual fashion, a reactor vessel 1 into which a substrate 2 to be coated is introduced. In the reactor vessel 1, a chemical bath 3 in which the substrate 2 to be coated is totally immersed or at least dipped in with its surface 2a to be coated is provided. It goes without saying that, as an alternative to dipping, the surface 2a to be coated can be suitably brought into contact with the chemical bath 3 in another way, e.g. by means of a conventional spraying or wetting technique, so that a liquid film of the bath solution 3 is formed on the surface 2a to be coated.

The chemical bath 3 is introduced into the reactor vessel 1 via a mixing vessel 4 in which the various bath constituents for preparing an appropriate chemical bath solution 5 are mixed. Specifically, the constituents are a metal salt, an organosulfide, a chelating agent which together with metal ions of the metal salt forms a chelate complex and ammonium hydroxide. In the example of FIG. 1, each of these four constituents are provided as the appropriate solution in deionized water in a dedicated vessel 6, 7, 8, 9, i.e. as a metal salt solution 10, a chelating agent solution 11, an organosulfide solution 12 and an ammonium hydroxide solution 13. Each of these four solutions can be introduced via an associated feed line 14, 15, 16, 17 into the mixing vessel 4. As merely one example of many further possibilities according to the invention, a solution of zinc sulfate ($ZnSO_4$) in deionized water is prepared as metal salt solution 10, a solution of nitrilotriacetic acid trisodium salt ($NA_3NTA$) or another salt of nitrilotriacetic acid in deionized water is prepared as chelating agent solution 11 and a solution of thioacetamide (TAA) in deionized water is prepared as organosulfide solution 12. It is also possible to use a salt of iminodiacetic acid instead of the salt of nitrilotriacetic acid. The four solution components 10 to 13 are mixed at room temperature in predeterminable volume ratios in the mixing vessel 4, with these volume ratios being determined so that the various chemical constituents in the mixing vessel 4, i.e. in the bath solution 5, have particular predeterminable concentrations or proportions. Specifically, the mixing process is selected so that the metal salt, e.g. $ZnSO_4$, is present in a concentration of from about 1 mM to about 50 mM, e.g. in a concentration of 5 mM, the chelating agent, e.g. $Na_3NTA$, is present in a concentration of from about 0.01 M to 1.0 M, e.g. in a concentration of 0.1 M, the organosulfide, e.g. TAA, is present in a concentration of from about 1 mM to about 150 mM, e.g. in a concentration of 5 mM, and ammonium hydroxide ($NH_4OH$) is present in a concentration of from about 0.01 M to 3.0 M, e.g. in a concentration of 1 M.

The bath solution 5 mixed in the mixing vessel 4 is introduced immediately after mixing into the reactor vessel 1 in order to effect the chemical bath deposition on the substrate surface 2a to be coated. For this purpose, the chemical bath 3 is maintained at a temperature of from about 40° C. to about 90° C. during the chemical bath deposition process. In the plant of FIG. 1, this is brought about by the reactor vessel 1 dipping into an appropriately heated, e.g. maintained at a temperature of about 60° C., water bath 18 which is located in an associated water bath vessel 19.

As can also be seen from FIG. 1, the reactor vessel 1 is moved uniformly up and down during the chemical bath deposition process in the example shown there, for which purpose an appropriate, reciprocating motor 20 is provided.

In the above-mentioned example of a $ZnSO_4$ solution as metal salt solution, a ZnS layer is wet chemically deposited under the conditions mentioned on the substrate surface 2a to be coated. In the case of a photovoltaic module substrate, this layer is deposited as a CBD zinc sulfide layer having the abovementioned properties on the substrate surface 2a, e.g. on the surface of a CIS or CIGS absorber layer.

It has been found that a uniform up and down motion of the reactor 1 and thus of the substrate surface 2a to be coated makes it possible to achieve a very homogeneous metal sulfide layer on the substrate surface 2a to be coated over a relatively large area, e.g. for module areas of from 0.1 $m^2$ to 1 $m^2$. The chosen concentration ratios of the constituents in the chemical bath 3 and the chosen water bath temperature influence the duration of the deposition process, the layer thickness and the layer quality of the CBD metal sulfide layer deposited, e.g. in respect of crystallinity, degree of coverage and pinhole density. It has been found that, according to the invention, a deposition/reaction time of significantly less than 10 minutes can be sufficient to form, for example, a CBD zinc sulfide buffer layer having a sufficient thickness of, for example, about 40 nm on an absorber layer of a photovoltaic module. After the chemical bath deposition process is complete, the substrate 2 is taken from the reactor 1, rinsed, e.g. with distilled water, and dried, e.g. by blowing dry by means of nitrogen.

Figure 2:
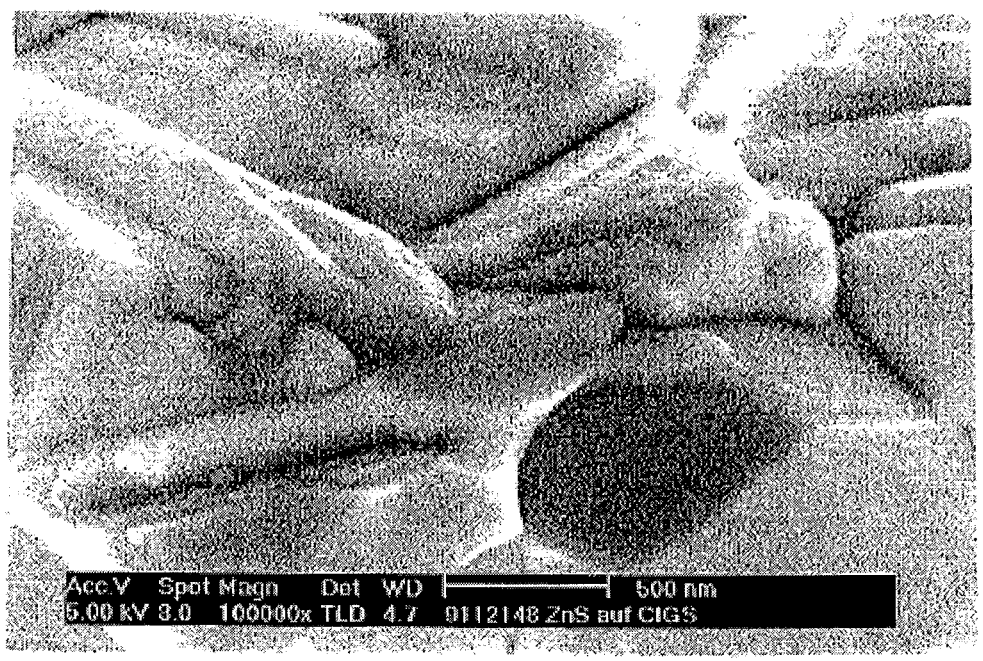
FIG. 2 shows a scanning electron micrograph of a fracture edge of a CBD zinc sulfide layer produced on a CIGS substrate using the equipment of FIG. 1

Thus, by using the chemical bath 3 having the composition indicated, a CBD zinc sulfide layer having a thickness of about 40 nm which is sufficient as buffer layer can be deposited on the photovoltaic absorber layer in a very short deposition/reaction time of significantly less than 10 minutes, e.g. of only about 4 minutes or even less. Furthermore, it is found that the CBD zinc sulfide layer deposited in this way on, for example, a CIS or CIGS absorber layer has good buffer layer properties. This can also be seen from the scanning electron micrograph of FIG. 2, from which it can be seen that the chemically bath deposited zinc sulfide buffer layer on the typically relatively rough CIGS absorber layer surface is completely closed and provides a perfect step covering. The ZnS buffer layer displays grains having typical dimensions in the nanometer range.

It can also be seen that metal sulfide layers of comparable quality can also be achieved by, as an alternative to the dipping technique mentioned, bringing the substrate surface to be coated into contact over its area with the bath deposition solution, i.e. with formation of a corresponding liquid film of the bath deposition solution on the substrate surface to be coated, by means of a conventional wetting or spraying technique. In each case, this contacting over its area of the surface to be coated with the bath deposition solution enables a desired heterogeneous deposition of the metal sulfide layer to be achieved. This heterogeneous deposition behavior contributes to a high layer quality without appreciable particle formation as is typical for homogeneous deposition techniques; the particle formation in homogeneous deposition techniques has in the present case proven to adversely affect the quality. In the present deposition process, the chelating agent plays an important role in achieving desired reaction/deposition kinetics.

Figure 3:
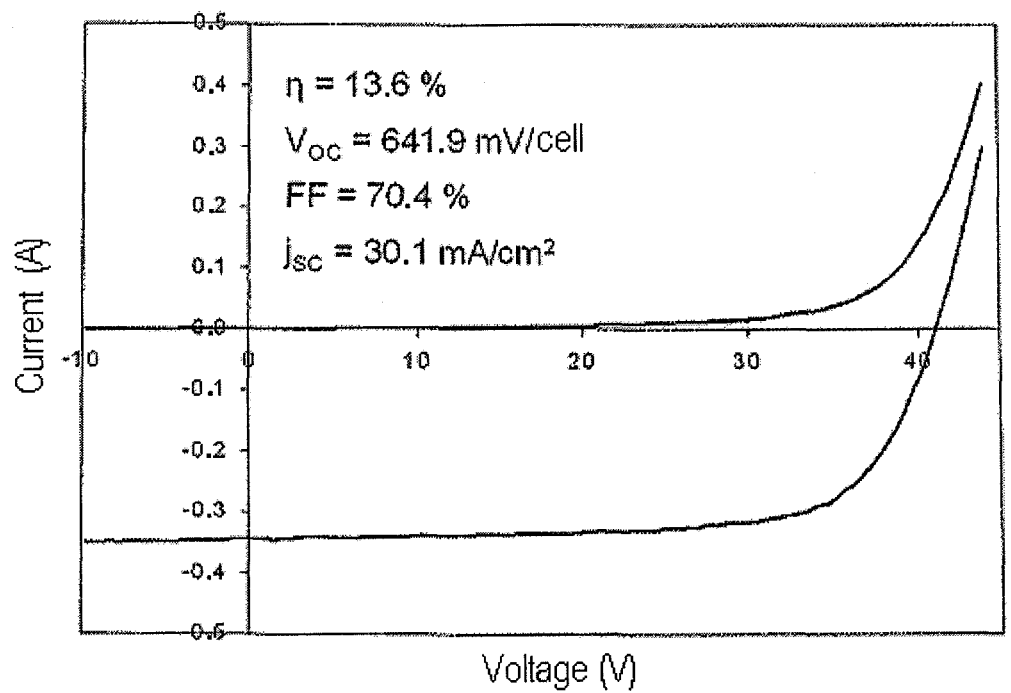
FIG. 3 shows a current-voltage curve for a solar cell module having a CBD zinc sulfide layer produced in the equipment of FIG. 1.

FIG. 3 shows, in graph form, important electrical parameters as were measured on a photovoltaic module which has a real dimensions of 30 cm×30 cm and comprises a CBD zinc sulfide buffer layer produced by the rapid chemical bath deposition process indicated on a CIGS absorber layer. The module considered by way of example has a layer structure composed of a glass substrate or glass support, a back contact layer composed of molybdenum on the glass support, a CIGS absorber layer on the back contact layer, said CBD zinc sulfide buffer layer applied according to the invention on the absorber layer, a ZnMgO layer as further buffer layer on the CBD zinc sulfide buffer layer and a ZnO:Al front contact layer on the ZnMgO layer. With the exception of the CBD zinc sulfide buffer layer produced according to the invention, this is a photovoltaic thin film structure which is conventional per se and has been described, for example, in the literature mentioned at the outset.

In the case of this module, the deposition of the CBD zinc sulfide buffer layer was carried out in a production plant of the type shown in FIG. 1 on a glass substrate having a size of 60 cm×120 cm to which the molybdenum back contact layer and the CIGS absorber layer had previously been applied. The rapid deposition process according to the invention gave a very good homogeneity of the CBD zinc sulfide buffer layer applied in a thickness of about 30 nm over significantly less than 10 minutes. The 60 cm×120 cm glass substrate with the CBD zinc sulfide buffer layer deposited according to the invention was then divided into 30 cm×30 cm modules. FIG. 3 shows the characteristics of such a 30 cm×30 cm CIGS module. As can be seen therefrom, this module displays very good photovoltaic properties, e.g. an efficiency of 13.6%, an open circuit voltage of 641.9 mV per single cell, a fill factor of 70.4% and a short circuit current density of 30.1 mA/cm$^2$.

It goes without saying that CBD zinc sulfide layers having a significantly lower thickness or a significantly greater thickness than the thickness of about 40 nm mentioned above by way of example can also be deposited by means of the invention and that other metal sulfide layers can also be deposited in the same way on a photovoltaic absorber layer or any other substrate surface to be coated. The short deposition time or high deposition rate which can be achieved by means of the bath deposition solution of the invention in combination with good layer properties of the chemically bath deposited layer, as are required, for example, for photovoltaic module buffer layers, are characteristic in each case. As a person skilled in the art will know, the various deposition parameters and in particular the proportions of the various constituents of the bath deposition solution of the invention have to be determined in a suitable way, e.g. empirically, for each individual case.

The invention claimed is:

1. A bath deposition solution for chemical bath deposition of a metal sulfide layer, the bath deposition solution comprising:
   a metal salt;
   an organosulfide;
   a chelating agent which with metal ions of the metal salt forms a chelate complex; and
   ammonium hydroxide, wherein
      the organosulfide is thioacetamide, and
      the chelating agent is one of nitrilotriacetic acid, iminodiacetic acid, and a metal salt thereof.

2. The bath deposition solution as claimed in claim 1, wherein:
   the metal salt is at least one of a Zn and an In salt.

3. The bath deposition solution as claimed in claim 2, wherein at least one of:
   the metal salt is present in a concentration of from about 1 mM to about 50 mM,
   the organosulfide is present in a concentration of from about 1 mM to about 150 mM,
   the chelating agent is present in a concentration of from about 0.01 M to about 1.0 M, and
   the ammonium hydroxide is present in a concentration of from about 0.01 M to about 3.0 M.

4. The bath deposition solution as claimed in claim 1, wherein at least one of:
   the metal salt is present in a concentration of from about 1 mM to about 50 mM,
   the organosulfide is present in a concentration of from about 1 mM to about 150 mM,
   the chelating agent is present in a concentration of from about 0.01 M to about 1.0 M, and
   the ammonium hydroxide is present in a concentration of from about 0.01 M to about 3.0 M.

5. The bath deposition solution as claimed in claim 1, wherein the solution has a pH in the basic range up to the neutral range.

6. The bath deposition solution as claimed in claim 2, wherein the solution has a pH in the basic range up to the neutral range.

7. The bath deposition solution as claimed in claim 3, wherein the solution has a pH in the basic range up to the neutral range.

* * * * *

UNITED STATES PATENT AND TRADEMARK OFFICE
CERTIFICATE OF CORRECTION

| | | |
|---|---|---|
| PATENT NO. | : 9,181,437 B2 | Page 1 of 1 |
| APPLICATION NO. | : 13/575670 | |
| DATED | : November 10, 2015 | |
| INVENTOR(S) | : Linda Buerkert et al. | |

It is certified that error appears in the above-identified patent and that said Letters Patent is hereby corrected as shown below:

On the title page, column 1, item (73) should read:

(73) Assignee:   Manz CIGS Technology GmbH,
                 Schwaebisch Hall (DE)

Signed and Sealed this
Sixteenth Day of February, 2016

Michelle K. Lee
*Director of the United States Patent and Trademark Office*